United States Patent
Watanabe

(12) 
(10) Patent No.: US 11,984,535 B2
(45) Date of Patent: May 14, 2024

(54) III-NITRIDE SEMICONDUCTOR LIGHT-EMITTING DEVICE COMPRISING BARRIER LAYERS AND WELL LAYERS AND METHOD OF PRODUCING THE SAME

(71) Applicant: DOWA Electronics Materials Co., Ltd., Tokyo (JP)

(72) Inventor: Yasuhiro Watanabe, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 539 days.

(21) Appl. No.: 17/283,544

(22) PCT Filed: Oct. 31, 2019

(86) PCT No.: PCT/JP2019/042891
§ 371 (c)(1),
(2) Date: Apr. 8, 2021

(87) PCT Pub. No.: WO2020/095826
PCT Pub. Date: May 14, 2020

(65) Prior Publication Data
US 2021/0391502 A1 Dec. 16, 2021

(30) Foreign Application Priority Data

Nov. 5, 2018 (JP) ................................ 2018-208392
Oct. 31, 2019 (JP) ................................ 2019-198185

(51) Int. Cl.
*H01L 33/00* (2010.01)
*H01L 21/02* (2006.01)
(Continued)

(52) U.S. Cl.
CPC ........ *H01L 33/325* (2013.01); *H01L 33/0075* (2013.01); *H01L 33/06* (2013.01); *H01L 33/14* (2013.01)

(58) Field of Classification Search
CPC ... H01L 33/0075; H01L 33/06; H01L 33/007; H01L 33/32; H01L 21/02505; H01L 21/02458; H01L 33/14; H01L 33/325
(Continued)

(56) References Cited

U.S. PATENT DOCUMENTS

2010/0219395 A1 9/2010 Hirayama et al.
2015/0287876 A1 10/2015 Han et al.
(Continued)

FOREIGN PATENT DOCUMENTS

EP 2858127 A1 4/2015
EP 3331035 A1 6/2018
(Continued)

OTHER PUBLICATIONS

Jul. 5, 2022, the Extended European Search Report issued by the European Patent Office in the corresponding European Patent Application No. 19881858.5.
(Continued)

*Primary Examiner* — Didarul A Mazumder
(74) *Attorney, Agent, or Firm* — KENJA IP LAW PC

(57) ABSTRACT

Provided is a III-nitride semiconductor light-emitting device having excellent light output power as compared with conventional devices and a method of producing the same. The III-nitride semiconductor light-emitting device has an emission wavelength of 200 nm to 350 nm and includes an n-type semiconductor layer; a light emitting layer in which N barrier layers 40b and N well layers 40w (where N is an integer) are alternately stacked in this order; an AlN guide layer; an electron blocking layer; and a p-type semiconductor layer in this order. The electron block layer is made of p-type $Al_zGa_{1-z}N$ ($0.50 \le z \le 0.80$), and the barrier layers are made of n-type $Al_bGa_{1-b}N$ ($z+0.01 \le b \le 0.95$).

5 Claims, 3 Drawing Sheets

(51) Int. Cl.
*H01L 33/06* (2010.01)
*H01L 33/14* (2010.01)
*H01L 33/32* (2010.01)

(58) Field of Classification Search
USPC .............................................. 257/79; 438/22
See application file for complete search history.

(56) References Cited

U.S. PATENT DOCUMENTS

| | | | |
|---|---|---|---|
| 2016/0268477 A1* | 9/2016 | Fujita | H01L 33/32 |
| 2017/0069793 A1* | 3/2017 | Saito | H01L 33/12 |
| 2017/0092807 A1* | 3/2017 | Okuno | H01L 33/0025 |
| 2017/0309785 A1* | 10/2017 | Watanabe | H01L 33/325 |
| 2017/0358705 A1 | 12/2017 | Kim | |
| 2018/0019375 A1* | 1/2018 | Fujita | H01L 33/32 |
| 2018/0166604 A1* | 6/2018 | Fujita | H01L 21/02579 |
| 2018/0240936 A1* | 8/2018 | Hong | H01L 33/04 |
| 2018/0287014 A1* | 10/2018 | Asada | H01L 33/32 |
| 2019/0140137 A1* | 5/2019 | Kim | A61N 5/06 |

FOREIGN PATENT DOCUMENTS

| | | |
|---|---|---|
| JP | H11112087 A | 4/1999 |
| JP | 2000091705 A | 3/2000 |
| JP | 2002314205 A | 10/2002 |
| JP | 2003273473 A | 9/2003 |
| JP | 2008311658 A | 12/2008 |
| JP | 2014241397 A | 12/2014 |
| JP | 2017034036 A | 2/2017 |
| JP | 6379265 B1 | 8/2018 |
| JP | 2018125429 A | 8/2018 |
| JP | 2018532265 A | 11/2018 |
| WO | 2016125492 A1 | 8/2016 |
| WO | 2017017891 A1 | 2/2017 |
| WO | 2018181044 A1 | 10/2018 |

OTHER PUBLICATIONS

May 11, 2021, International Preliminary Report on Patentability issued in the International Patent Application No. PCT/JP2019/042891.
Jan. 28, 2020, International Search Report issued in the International Patent Application No. PCT/JP2019/042891.
Jan. 28, 2020, Notification of Reasons for Refusal issued by the Japan Patent Office in the corresponding Japanese Patent Application No. 2019-198185.
Oct. 15, 2020, Office Action issued by the Taiwan Intellectual Property Office in the corresponding Taiwanese Patent Application No. 108139844.

* cited by examiner

III-NITRIDE SEMICONDUCTOR LIGHT-EMITTING DEVICE COMPRISING BARRIER LAYERS AND WELL LAYERS AND METHOD OF PRODUCING THE SAME

TECHNICAL FIELD

This disclosure relates to a III-nitride semiconductor light-emitting device and a method of producing the same. This disclosure relates in particular to a III-nitride semiconductor light-emitting device having excellent light output power and a method of producing the same.

BACKGROUND

Conventionally, III-nitride semiconductors made of compounds in which N is combined with Group III elements such as Al, Ga, In, etc. are used as materials for light-emitting devices emitting blue to deep ultraviolet light. III-nitride semiconductors made of AlGaN having a high Al composition ratio are particularly used for deep ultraviolet light light-emitting devices (DUV-LEDs) emitting light with a wavelength of 200 nm to 350 nm.

In general, deep ultraviolet light-emitting devices using III-nitride semiconductors exhibit significantly low light emission efficiency and achieving higher output using such a device has been said to be difficult. Meanwhile, various attempts have been made to achieve high light extraction efficiency and low resistance properties in addition to improved internal quantum efficiency with a view to obtaining a small and high-output deep ultraviolet light-emitting device.

A known example of such a deep ultraviolet light-emitting device is a III-nitride semiconductor light-emitting device 1 having an n-type semiconductor layer 3, a light emitting layer 4 in which barrier layers 4b and well layers 4w are alternately stacked, an electron blocking layer 6, and a p-type semiconductor layer 7 in this order. A part of the band structure of the III-nitride semiconductor light-emitting device 1 is depicted in FIG. 1A. As illustrated in FIG. 1A, the Al composition ratio of the electron blocking layer 6 is typically set to be higher than the Al composition ratio of the barrier layers 4b in conventional devices.

For example, JP 2014-241397 A (PTL 1) describes that in a nitride semiconductor light-emitting device with an emission wavelength of 200 nm to 350 nm, the Al composition ratio (a) of barrier layers in a light emitting layer and the Al composition ratio (b) of a p-type cladding layer have the relation $0.1 < b-a \leq 0.45$, and the Al composition ratio (a) and the Al composition ratio (c) of an electron blocking layer have the relation $0.11 \leq c-a \leq 0.98$. According to PTL 1, such relations between the Al composition ratios can increase the light output power of a nitride semiconductor light emitting device.

Further, the applicant of the present application proposes in JP 2017-034036 A (PTL 2), a III-nitride semiconductor light-emitting device 1' obtained by providing an AlN guide layer 5 between the light emitting layer 4 and the electron blocking layer 6 in the III-nitride semiconductor light-emitting device 1 thereby increasing the reliability and the light output power of the device (see the band structure in FIG. 1B).

CITATION LIST

Patent Literature

PTL 1: JP 2014-241397 A
PTL 2: JP 2017-034036 A

SUMMARY

Technical Problem

In recent years, there is an increasing demand for deep ultraviolet light-emitting devices (DUV-LEDs) with increased light output power, and further improvement is desired.

It could therefore be helpful to provide a III-nitride semiconductor light-emitting device that has excellent light output power, and a method of producing the same.

Solution to Problem

The inventor of this disclosure diligently studied ways to increase the light output power in cases where the AlN guide layer 5 is provided between the light emitting layer 4 and the electron blocking layer 6 as in PTL 2. As a result, they found that in cases where the AlN guide layer 5 is provided, in spite of the typical relation between the Al composition ratios of barrier layers and an electron blocking layer: ([Al composition ratio of barrier layer]<[Al composition ratio of electron blocking layer]), when the Al composition ratio of the barrier layers is intentionally set to be higher than that of the electron blocking layer, excellent light output power can be obtained.

We propose the following features based on the above discovery.

(1) A III-nitride semiconductor light-emitting device having an emission wavelength of 200 nm to 350 nm, comprising:
an n-type III-nitride semiconductor layer; a III-nitride semiconductor light emitting layer in which N barrier layers and N well layers having a smaller band gap than the barrier layers, where N is an integer, are alternately stacked in this order; an AlN guide layer; an electron blocking layer; and a p-type III-nitride semiconductor layer in this order,
wherein the electron block layer is made of p-type $Al_zGa_{1-z}N$ ($0.50 \leq z \leq 0.80$), and
the barrier layers are made of n-type $Al_bGa_{1-b}N$ ($z+0.01 \leq b \leq 0.95$).

(2) The III-nitride semiconductor light-emitting device according to (1) above, wherein an Al composition ratio (b) of the barrier layers is $b \leq z+0.20$.

(3) The III-nitride semiconductor light-emitting device according to (1) or (2) above, wherein a thickness of the AlN guide layer is 0.5 nm or more and 2.0 nm or less.

(4) The III-nitride semiconductor light-emitting device according to any one of (1) to (3) above, wherein the Nth well layer in the III-nitride semiconductor light emitting layer is in contact with the AlN guide layer, or wherein a final barrier layer having an Al composition ratio that is equal to or more than the Al composition of the barrier layers and is less than the Al composition ratio of the AlN guide layer is provided between the Nth well layer in the III-nitride semiconductor light emitting layer and the AlN guide layer, and a thickness of the final barrier layer is 1.5 nm or less.

(5) A method of producing a III-nitride semiconductor light-emitting device having an emission wavelength of 200 nm to 350 nm, the method comprising:
a first step of forming an n-type III-nitride semiconductor layer;
a second step of forming a III-nitride semiconductor light emitting layer by alternately staking N barrier layers and N well layers having a smaller band gap than the barrier layers, where N is an integer, in this order on the n-type III-nitride semiconductor layer;
a third step of forming an AlN guide layer on the III-nitride semiconductor light emitting layer;
a fourth step of forming an electron blocking layer on the AlN guide layer; and
a fifth step of forming a p-type semiconductor layer on the electron blocking layer,
wherein the electron block layer is made of p-type $Al_zGa_{1-z}N$ ($0.50 \leq z \leq 0.80$), and
the barrier layers are made of n-type $Al_bGa_{1-b}N$ ($z+0.01 \leq b \leq 0.95$).

Advantageous Effect

This disclosure can provide a III-nitride semiconductor light-emitting device having more excellent light output power than conventional devices.

BRIEF DESCRIPTION OF THE DRAWINGS

In the accompanying drawings.

DETAILED DESCRIPTION

Figure 1A:
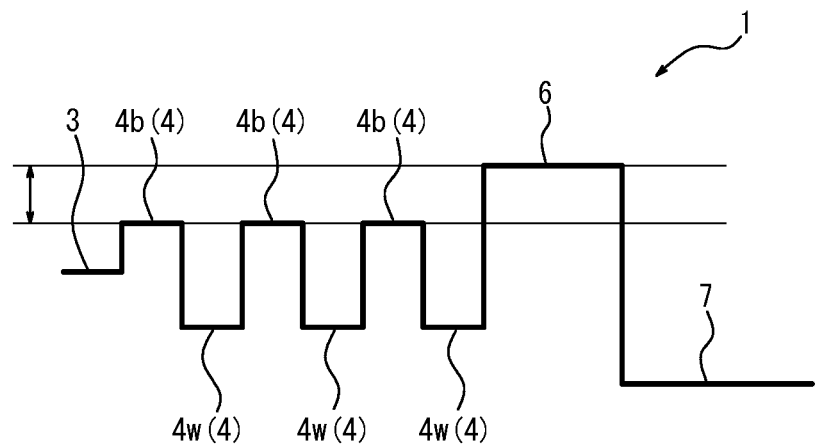
FIG. 1A is a diagram illustrating an example of a part of the band structure of a conventionally known III-nitride semiconductor light-emitting device.

Prior to describing embodiments of this disclosure, the following points are described beforehand. First, the term "AlGaN" alone for which the Al composition ratio is not specified means a given compound that has a chemical composition ratio of group III elements (Al and Ga in total) with respect to N of 1:1 and has any given ratio between the group III elements of Al and Ga. In this case, even if no reference is made to In that is a group III element, In may be contained at 5% or less with respect to the III elements of Al and Ga. Further, compositions simply referred to as "AlN" and "GaN" mean the compositions that do not contain Ga and Al, respectively; however, a composition simply referred to as "AlGaN" does not exclude cases where the composition is one of AlN and GaN. Note that the values of the Al composition ratios can be found for example by photoluminescence spectroscopy or X-ray diffractometry.

Further, in this specification, a III-nitride semiconductor layer exhibiting electrically p-type properties may be abbreviated to a p-type layer, and a III-nitride semiconductor layer exhibiting electrically n-type properties may be abbreviated to an n-type layer. On the other hand, a layer that is not intentionally doped with certain impurities such as Mg and Si and does not serve as an electrically p-type or n-type layer is referred to as an "i-type" layer or an "undoped" layer. An undoped layer may contain impurities that are inevitably mixed in the production process. Specifically, when the carrier density is low (for example, less than $4 \times 10^{16}$ atoms/$cm^3$), the layer is referred to as an "undoped" layer in this specification. Further, the values of the impurity concentrations of Mg, Si, etc. are determined by SIMS analysis.

The total thickness of epitaxially grown layers can be measured using an interference thickness measurement system. Further, when the composition ratios of the adjacent layers are sufficiently different (for example, the Al composition ratios differ by 0.01 or more), the thickness of each layer can be calculated by observing a cross section of the grown layers under a transmission electron microscope (TEM). For two of the adjacent layers that have the same or substantially the same Al composition ratios (for example, the difference is less than 0.01) but have different impurity concentrations, the boundary and the thickness of such two adjacent layers are found based on TEM-EDS data. The impurity concentrations of such two layers can be measured by SIMS analysis. Further, when the thickness of each layer is thin as in a superlattice structure, the thickness can be measured by TEM-EDS.

Embodiments of this disclosure will now be described with reference to the drawings. In principle, like components are denoted by like reference numerals, and the description will not be repeated. A substrate and layers in FIG. 2 are exaggerated in thickness for convenience of description, so that the ratio between the vertical and horizontal dimensions of each illustrated component does not conform to the actual ratio.

(III-Nitride Semiconductor Light-Emitting Device)

Figure 2:
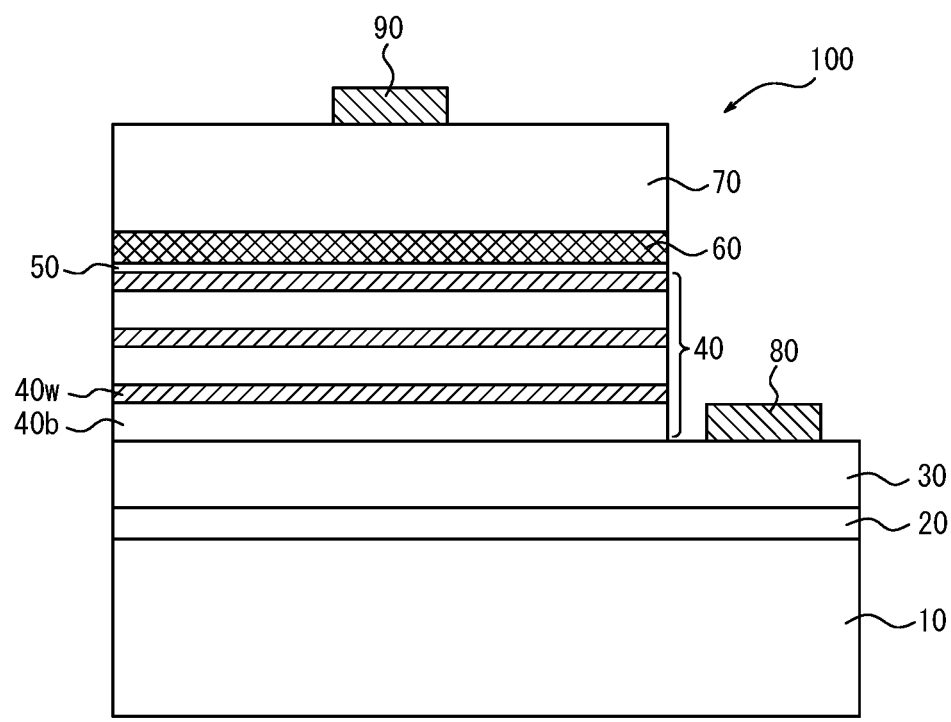
FIG. 2 is a schematic cross-sectional view illustrating a III-nitride semiconductor light-emitting device according to one embodiment of this disclosure.

As illustrated in FIG. 2, a III-nitride semiconductor light-emitting device 100 according to one embodiment of this disclosure has an n-type III-nitride semiconductor layer 30; a III-nitride semiconductor light emitting layer 40 in which N barrier layers 40b and N well layers 40w having a smaller band gap than the barrier layers 40b (where N is an integer) are alternately stacked in this order; an AlN guide layer 50; an electron blocking layer 60; and a p-type III-nitride semiconductor layer 70 in this order. In this specification, the Al composition ratio of the barrier layers 40b is represented by b, the Al composition ratio of the well layers 40w is represented by w, and the Al composition ratio of the electron blocking layer 60 is represented by z. In the disclosed III-nitride semiconductor light-emitting device 100, the Al composition ratio (b) of the barrier layers 40b is higher than the Al composition ratio (z) of the electron blocking layer 60. Hereinafter, the n-type III-nitride semiconductor layer 30 is abbreviated to "n-type layer 30", the III-nitride semiconductor light emitting layer 40 is abbreviated to "light emitting layer 40" and the p-type III-nitride semiconductor layer 70 is abbreviated to "p-type layer 70".

As illustrated in FIG. 2, the n-type layer 30 of the III-nitride semiconductor light-emitting device 100 can be provided on an AlN template substrate in which an AlN layer 20 is provided on a surface of a substrate 10. Further, the III-nitride semiconductor light-emitting device 100 may be provided with an n-type electrode 80 formed on the n-type layer 30 exposed by partially removing the light emitting layer 40, the AlN guide layer 50, the electron blocking layer 60, and the p-type layer 70 by etching etc.; and with a p-type electrode 90 formed on the p-type layer 70. The substrate 10, the AlN layer 20, the n-type electrode 80, and the p-type electrode 90 may have a typical structure of conventionally known typical III-nitride semiconductor light-emitting devices, and the structure is not limited. Although not illustrated, one or more buffer layers that are selected from an AlGaN layer, a composition graded layer, and a super-lattice layer may be provided between the AlN layer 20 and the n-type layer 30.

<N-Type Layer>

The n-type layer 30 is a III-nitride semiconductor layer containing at least Al, and a typical n-type semiconductor layer may be used as the n-type layer 30 as long as it serves as an n-type semiconductor layer in the III-nitride semiconductor light-emitting device 100. The n-type layer 30 may be, for example, made of an AlGaN material which may contain In in an amount of 5% or less of the amount of Al and Ga as group III elements. The n-type layer 30 is doped with an n-type dopant (impurity). Examples of the n-type dopant include Si, Ge, Sn, S, O, Ti, and Zr. The dopant concentration is not limited as long as the n-type layer 30 can serve as an n-type layer; for example, the dopant concentration can be $1.0 \times 10^{18}$ atoms/cm$^3$ to $1.0 \times 10^{20}$ atoms/cm$^3$. Further, the Al content of the n-type layer 30 is not particularly limited and may be within a typical range. The n-type layer 30 may be constituted by a single layer or a plurality of layers. Alternatively, the n-type layer 30 may have a structure including a composition graded layer in which the composition ratios of the group III elements are graded in the crystal growth direction, or a superlattice layer. The n-type layer 30 not only forms a contact portion connected to an n-side electrode but also serves to increase the crystallinity from the substrate toward the light emitting layer.

<N-Type Guide Layer>

Although not illustrated in FIG. 2, an n-type guide layer 35 may be provided between the light emitting layer 40 and the n-type layer 30. The n-type guide layer 35 preferably uses an AlGaN material, and it is preferred that the Al composition ratio of the n-type guide layer is equal to or more than the Al composition ratio of the n-type layer 30 and is equal to or less than the Al composition ratio (b) of the barrier layers 40b. The thickness of the n-type guide layer may be 3 nm to 30 nm. Further, the n-type guide layer 35 is preferably doped with an n-type dopant (impurity) as with the n-type layer, and the dopant dose is preferably lower than that for the n-type layer.

<Light Emitting Layer>

In the III-nitride semiconductor light-emitting device 100, the light emitting layer 40 is provided following the formation of the n-type layer 30. The light emitting layer 40 is configured so that the N barrier layers 40b and the N well layers 40w having a smaller band gap than the barrier layers 40b (where N is an integer) are alternately stacked in this order. For example, for the barrier layers 40b and the well layers 40w, AlGaN materials having different Al composition ratios may be used. If necessary, the barrier layers 40b and the well layers 40w may be made of for example an AlGaInN material in which a group III element such as In is contained in a composition ratio of 5% or less; however, an AlGaN ternary system material using only Al and Ga as group III elements is preferred. The well layers 40w may be of n-type or i-type; however, the barrier layers 40b are of n-type. This increases the electron concentration, resulting in passivation of crystal defects in the well layers. Note that the light emitting layer 40 corresponds to a structure obtained by removing, from a typical multiple quantum well (MQW) structure in which the barrier layers 40b and the well layers 40w are repeatedly formed to form a stack sandwiched between barrier layers 40b, the barrier layer closest to the p-type semiconductor layer.

<<Barrier Layers and Well Layers>>

An $Al_bGa_{1-b}N$ material is used for the barrier layers 40b, and an $Al_wGa_{1-w}N$ material is used for the well layers 40w. The Al composition ratio (b) of each barrier layer 40b may be, for example, 0.51 to 0.95, more preferably 0.53 to 0.85, and the Al composition ratio (w) of each well layer 40w may be, for example, 0.30 to 0.80 (where w<b). Further, the number N of the barrier layers 40b and the well layers 40w is a positive integer, for example, from 1 to 10. Further, the thickness of the barrier layers 40b may be 3 nm to 30 nm, and the thickness of the well layers 40w may be 0.5 nm to 5 nm.

The inventor of this disclosure found that the light output power can be further improved by setting the Al composition ratio (b) of the barrier layers 40b to be higher than the Al composition ratio (z) of the electron blocking layer such that $z+0.01 \leq b \leq 0.95$. Further, in order to ensure the light output power improving effect, the upper limit of the Al composition ratio (b) of the barrier layers 40b is preferably set to $z+0.2$ ($b \leq z+0.2$), more preferably $z+0.17$ ($b \leq z+0.17$), particularly preferably $z+0.15$ ($b \leq z+0.15$). The Al composition ratio (b) of the barrier layers 40b is particularly preferably set so that $z+0.05 \leq b \leq z+0.15$.

The center wavelength of light to be emitted can be substantially controlling by selecting the Al composition ratio (w) of the well layers 40w. The center wavelength of light may be set to 200 nm to 350 nm, preferably 200 nm to 300 nm, still more preferably 270 nm to 295 nm. For example, when the Al composition ratio (w) of the well layers 40w in the light emitting layer 40 is set to 0.35 or more, the center wavelength of the light emitted from the light emitting layer 40 is 300 nm or less.

Figure 3A:
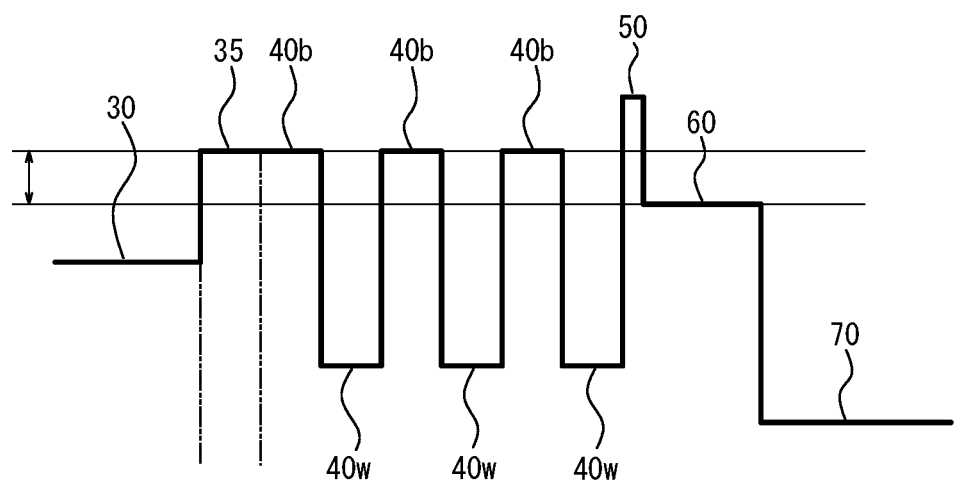
FIG. 3A is a diagram illustrating a part of the band structure of an aspect of a III-nitride semiconductor light-emitting device according to this disclosure.
Figure 3B:
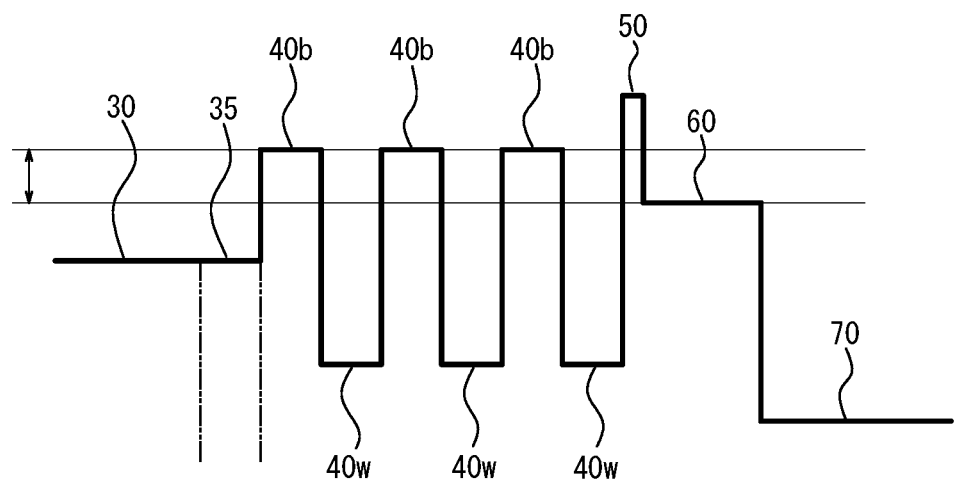
FIG. 3B is a diagram illustrating a part of the band structure of another aspect of a III-nitride semiconductor light-emitting device according to this disclosure.

Here, FIG. 3A and FIG. 3B each illustrate an aspect of the band structure of the conduction band of the III-nitride semiconductor light-emitting device 100 according to one embodiment of this disclosure. The band structures that are characteristic of this disclosure compared with FIG. 1B of the above conventionally known band structure will be described. As illustrated in the conventional example of FIG. 1B, the band gap of the electron blocking layer 60 has been typically set to be larger than that of the barrier layers by setting the Al composition ratio of the electron blocking layer 60 to be higher than the Al composition ratio (b) of the barrier layers 40b, for example, as in an $Al_zGa_{1-z}N$ material (b<z<1).

Figure 1B:
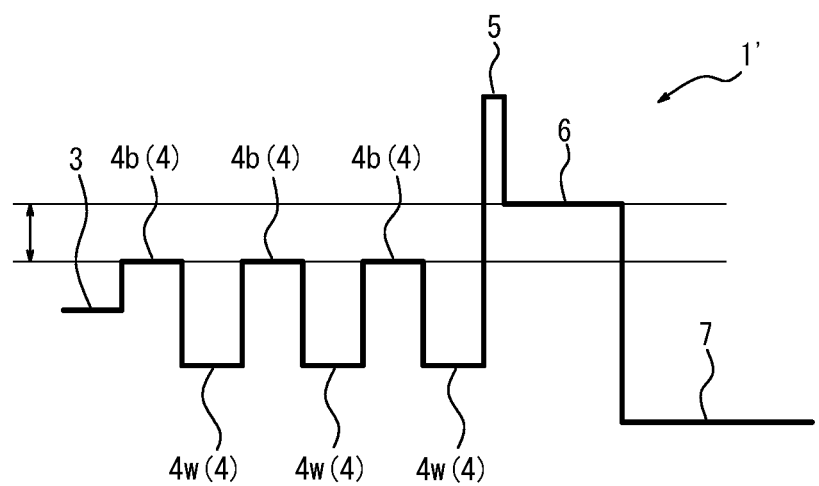
FIG. 1B is a diagram illustrating another example of a part of the band structure of a conventionally known III-nitride semiconductor light-emitting device.

In comparison with the band structure in FIG. 1B, FIG. 3A according to the embodiment of this disclosure illustrates a structure in which the Al composition ratio (b) of the barrier layers 40b is set to obtain a large band gap of the electron blocking layer 60. Specifically, the Al composition ratio (b) of the barrier layers 40b is set to be higher than the Al composition ratio (z) of the electron blocking layer 60 (to be described below in detail) so that the relation $z+0.01 \leq b \leq 0.95$ is satisfied. FIG. 3A illustrates a case where the n-type guide layer 35 has the same band gap as the barrier layers 40b, and FIG. 3B illustrates a case where the n-type guide layer 35 has a band gap that is the same as that of the n-type layer 30 and is different from that of the barrier layers 40b. In either case, the Al composition ratio (b) of the barrier layers 40b is set to be higher than the Al composition ratio (z) of the electron blocking layer 60.

The inventor experimentally confirmed that the difference between the band gaps of the barrier layers and the electron blocking layer, according to this disclosure makes it possible to obtain a III-nitride semiconductor light-emitting device having more excellent light output power than conventional devices. Without intending to be bound by theory, the inventor considers that such an effect can be obtained in this disclosure for the following reasons. First, since AlGaN-based semiconductor materials used as materials for DUV-LEDs have a relatively large band gap and it is difficult to reduce the resistance. In particular, it is difficult to improve the hole concentration in the p-type AlGaN layer. Accordingly, the contact resistance in an electrode portion increases, and a high forward voltage Vf is required to drive the device. On the other hand, as a higher forward voltage Vf is applied to drive the device, the carrier concentration becomes higher and electrons having a large diffusion length is considered to relatively easily overflows in the p-type electron blocking layer. Here, since the electron injection efficiency is deteriorated, the light output power of the DUV-LEDs decreases correspondingly. However, increasing the Al composition ratio of the barrier layers can suppress the overflow of the electrons, which will improve the light output power. The effect obtained by increasing the Al composition ratio of the barriers according to this disclosure is great particularly when the center wavelength of the light is 300 nm or less even if the device emits light with 200 nm to 350 nm for which a high forward voltage Vf is required. On the other hand, for a center wavelength in a wavelength range exceeding 300 nm, the Al composition ratio of the electron blocking layer provided may be lower than that for a center wavelength of 300 nm or less, thus the hole injection efficiency in the electron blocking layer can be easily improved. Even in this case, increasing the Al composition ratio of the barrier layers 40$w$ has the overflow suppression effect, and this disclosure is still effective although the effect is smaller than in the case of a center wavelength in the range of 300 nm or less. This may be because when the Al composition ratio of the barrier layers is increased, the concentration of electrons can be reduced in well layers closer to the p-type electron block layer. Although increasing the Al composition ratio of the p-type electron blocking layer would also possibly reduce the overflow, the hole injection is reduced accordingly in this case, and the increase is assumed to have an adverse effect for a center wavelength of 300 nm or less.

<AlN Guide Layer>

Subsequent to the formation of the light emitting layer 40, the AlN guide layer 50 is provided on the light emitting layer 40. The AlN guide layer 50 is most preferably a nitride semiconductor layer made of AlN, in which the composition ratio of Al in group III elements is 100%. Note however that considering cases where other group III elements (such as Ga) are inevitably mixed during the production process, gas produced during alteration, and the state of process of the alteration; the AlN guide layer 50 may include layers having an Al composition ratio of 96% to 100%. The thickness of the AlN guide layer 50 is preferably 0.5 nm or more and 2.0 nm or less, more preferably 0.7 nm or more and 1.7 nm or less. The guide layer 50 is preferably undoped (i-type); alternatively, a p-type dopant such as Mg or an n-type dopant such as Si may be added. Further, the impurity concentration in the AlN guide layer 50 is not necessarily uniform; for example, the impurity concentration may vary between the light emitting layer 40 side and the p-type layer 70 side. When a dopant is added, the AlN guide layer 50 may be partially or wholly of p-type or n-type in the end instead of being of i-type.

A layer of "i-type" refers to a layer which is not designed to be doped with specific impurities (also referred to as "undoped layer") as described above. It should be noted that even when a p-type dopant diffuses from the p-type layer 70, the AlN guide layer 50 is not designed to be doped with specific impurities.

<Final Barrier Layer>

Here, the III-nitride semiconductor light-emitting device 100 may additionally have a final barrier layer having a band gap that is equal to or more than that of the barrier layers 40$b$ and is less than that of the AlN guide layer 50 between the Nth well layer 40$w$ from the AlN guide layer 50 and the AlN guide layer 50 in the light emitting layer 40. When an $Al_fGa_{1-f}N$ material is used for the final barrier layer, the Al composition ratio of the final barrier layer (f) preferably satisfies b≤f≤0.95 with respect to the Al composition ratio (b) of the barrier layers. In this case, the thickness of the final barrier layer is set to be 1.5 nm or less, and is preferably 0.1 nm or more and 1.0 nm or less that is significantly smaller than the thickness of a final barrier layer used in conventional techniques. In a case where part of the final barrier layer is altered due to switching of carrier gases described in PTL 2 mentioned above to form an AlN guide layer, when the thickness of the final barrier layer is 0.1 nm or more, one atomic layer that is not susceptible to the alteration is left, thus the Nth (from the electron blocking layer 60 side) well layer 40$w$ can be prevented from being altered.

<Electron Blocking Layer>

Subsequently, the electron blocking layer 60 is provided in contact with the AlN guide layer 50. The electron blocking layer 60 is typically provided between a multiple quantum well (MQW) structure serving as the light emitting layer and the p-type layer (p-type cladding layer or p-type contact layer) to stop electrons so as to be used as a layer that allows the electrons to be injected into the light emitting layer (the well layers in the case of the MQW strusctu) thereby improving the electron injection efficiency. When the Al composition ratio of the light emitting layer is high, the hole concentration in the p-type layer 70 is low, which makes it difficult to inject holes into the light emitting layer, in which case, the electrons would partly flow toward the p-type layer 70 side. The provision of the electron blocking layer 60 can avoid such a flow of electrons. Also in this embodiment, the electron blocking layer 60 provided to be adjacent to the AlN guide layer 50 can avoid the flow of electrons to the p-type layer 70 side as with the case described above and can increase the electron injection efficiency.

As described above, conventionally, such an electron blocking layer 60 typically has an Al composition ratio (z) higher than the Al composition ratio (b) of the barrier layers 40, for example as in an $Al_zGa_{1-z}N$ material (b<z<1). However, in this disclosure, in contrast to such common knowledge in the art, the Al composition ratio (z) of the electron blocking layer is set to be lower than the Al composition ratio (b) of the barrier layers. The inventor found that the light output power can be further improved by forming the electron blocking layer 60 from $Al_zGa_{1-z}N$ (0.5≤z≤0.8) with the Al composition ratio (z) being lower than the Al composition ratio (b) of the barrier layers 40$b$, satisfying z+0.01≤b (accordingly, z≤b−0.01). The thickness of the whole electron blocking layer 60 is preferably, for example, 6 nm to 60 nm. The p-type dopant added to the electron blocking layer is the same as the p-type dopant to be added to the p-type layer 70, to be described below; however, if necessary, a dopant other than p-type dopants may be added, or an undoped region may be partially provided.

<P-Type Layer>

The p-type layer 70 provided subsequent to the formation of the electron blocking layer 60 is not limited as long as holes can be injected into the light emitting layer 40, and may have a typical structure. For example, the p-type layer 70 may be constituted by a p-type contact layer alone or may have a multi-layer structure including a p-type cladding layer and a p-type contact layer thereon using AlGaN materials having different Al composition ratios (the details will be described below). Examples of the p-type dopant to be added to the p-type layer 70 include Mg, Zn, Ca, Be, and Mn. Further, the average dopant concentration of the whole p-type layer 70 is not limited as long as the layer exhibits p-type properties, and can be for example $1.0 \times 10^{18}$ atoms/cm$^3$ to $5.0 \times 10^{21}$ atoms/cm$^3$.

The Al composition ratio of the p-type "cladding layer" herein refers to an Al composition ratio more than 0.1 lower than that of the electron blocking layer and more than 0.1 higher than that of the p-type contact layer. When the Al composition ratio of the p-type cladding layer is y, the Al composition ratio of the electron blocking layer 60 is z, and the Al composition ratio of the p-type contact layer is x; the relation $x+0.1<y<z-0.1$ must hold.

In the III-nitride semiconductor light-emitting device 100 according to this embodiment, the p-type cladding layer is optional and is not necessarily provided. It is preferred that the p-type layer 70 is constituted only by a p-type contact layer. When a p-type cladding layer is provided, its thickness may be 2 nm to 300 nm. The thickness of the p-type contact layer may be 5 nm or more and 200 nm or less. Although not illustrated, the p-type contact layer preferably has a multi-layer structure (including a superlattice structure) in which any one or more of the Al composition ratio, dopant species, dopant concentration, carrier gas used in the formation, and the like are varied.

Specific Aspect

Specific aspects of the substrate 10, the AlN layer 20, the n-type electrode 80, and the p-type electrode 90 depicted in FIG. 2 will be described below by way of example, yet various modifications are possible. As stated above, in the disclosed embodiments, the substrate 10, the AlN layer 20, the n-type electrode 80, and the p-type electrode 90 depicted in FIG. 2 do not limit this disclosure in any way.

A sapphire substrate can be used as the substrate 10 of the III-nitride semiconductor light-emitting device 100. An AlN template substrate in which the AlN layer 20 is epitaxially grown on a surface of the sapphire substrate may be used. Any given sapphire substrate can be used as the sapphire substrate, and the substrate may optionally have an off-angle. When an off-angle is provided, the crystallographic orientation in the tilt direction may be either in the m axis direction or in the a axis direction. For example, a main surface of the sapphire substrate may be the C plane tilted at an off-angle of 0.5°. When the AlN template substrate is used, the crystallinity of the AlN layer on the surface of the sapphire substrate is preferably excellent. Further, it is also preferred that a surface of the AlN template substrate is provided with an undoped AlGaN layer. Alternatively, an AlN single crystal substrate may be used as the substrate 10.

The n-type electrode 80 may be, for example, a metal composite film having a Ti-containing film and an Al-containing film formed on the Ti-containing film. The thickness, shape, and size of each of these films in the n-type electrode may be selected as appropriate in accordance with the shape and the size of the light-emitting device.

On the other hand, the p-type electrode 90 may be, for example, a metal composite film having a Ni-containing film and a Au-containing film formed on the Ni-containing film. The thickness, shape, and size of these films in the p-type electrode may be appropriately selected in accordance with the shape and size of the light-emitting device.

Method of Producing III-Nitride Semiconductor Light-Emitting Device: First Embodiment Next, a first embodiment of the disclosed method of producing a III nitride semiconductor light emitting device 100 will be described. The production method according to the first embodiment includes: a first step of forming an n-type III-nitride semiconductor layer 30 (hereinafter, n-type layer 30); a second step of forming a III-nitride semiconductor light emitting layer 40 (hereinafter, light emitting layer 40) by alternately stacking N barrier layers 40b and N well layers 40w having a smaller band gap than the barrier layers 40b (where N is an integer) in this order, on the n-type layer 30; a third step of forming an AlN guide layer 50 on the light emitting layer 40; a fourth step of forming an electron blocking layer 60 on the AlN guide layer 50; and a fifth step of forming a p-type III-nitride semiconductor layer 70 on the electron blocking layer 60. The electron blocking layer 60 is made of p-type $Al_zGa_{1-z}N$ ($0.5 \leq z \leq 0.80$) and the barrier layers 40b are made of n-type $Al_bGa_{1-b}N$ ($z+0.01 \leq b \leq 0.95$) as described above, and this is one of the characteristic features of this disclosure.

Here, in the first embodiment, in the above third step, the AlN guide layer 50 can be epitaxially grown using a source gas composed of trimethylaluminum gas and ammonia gas.

First, a sapphire substrate is typically prepared as the substrate 10. An AlN template substrate in which an AlN layer 20 is formed on a surface of the substrate 10 is preferably formed, and a commercially available AlN template substrate may be used. The AlN layer 20 can be formed by a known thin film deposition technique, for example, by metalorganic chemical vapor deposition (MOCVD), molecular beam epitaxy (MBE), or sputtering.

For the source of Al for the AlN layer 20, trimethylaluminum (TMA) can be used. Meanwhile, for the N source, ammonia (NH$_3$) gas can be used. Those source gases can be used to form the AlN layer 20 using hydrogen gas as a carrier gas.

The temperature for growing the AlN layer 20 is preferably, but not limited to, 1270° C. or more and 1350° C. or less, and more preferably 1290° C. or more and 1330° C. or less. With this temperature range, the crystallinity of the AlN layer 20 can be improved when heat treatment is performed after that. Further, the growth pressure in the chamber can be, for example, 5 Torr to 20 Torr. More preferably, the growth pressure is 8 Torr to 15 Torr.

The molar ratio of a group V element gas such as NH$_3$ gas to a group III element gas such as TMA gas, calculated based on the growth gas flow rates of the group V element gas and the group III element gas (hereinafter referred to as V/III ratio) can be, for example, 130 or more and 190 or less. The molar ratio is more preferably 140 or more and 180 or less. Note that since the optimum V/III ratio depends on the growth temperature and the growth pressure, the growth gas flow rate is preferably determined appropriately.

Subsequently, the AlN layer 20 on the substrate 10, for example made of sapphire obtained as described above is preferably subjected to a heat treatment at a temperature higher than the growth temperature of the AlN layer 20. The heat treatment process can be performed using a known heat treatment furnace. Performing the heat treatment allows the half width of the X-ray rocking curve of the (10-12) plane of the AlN layer 20 to be 400 s or less; thus, high crystallinity can be achieved.

It is also preferred that an undoped AlGaN layer is formed on the AlN layer 20 after that. A layer made of an AlGaN material can be formed using TMA as an Al source, trimethylgallium (TMG) as a Ga source, and $NH_3$ gas as an N source. This also applies to the formation of the n-type layer 30, the n-type guide layer 35, the light emitting layer 40, the final barrier layer, the AlN guide layer 50, the electron blocking layer 60, and the p-type layer 70 to be described. These source gases may be supplied into a chamber using hydrogen gas, nitrogen gas, or a mixed gas of hydrogen and nitrogen as a carrier gas. The V/III ratio calculated based on the growth gas flow rate of the group V element gas such as $NH_3$ gas to that of the group III element gas such as TMA gas can be, for example, 100 or more and 100000 or less. More preferably, the V/III ratio is 300 or more and 30000 or less. Since the optimum V/III ratio depends on the growth temperature and the growth pressure, the growth gas flow rate is preferably determined appropriately as in the case of forming the AlN layer 20.

Next, the first step of forming the n-type layer 30 is performed. The n-type layer 30 can be formed on the AlN layer 20, preferably on an undoped AlGaN layer. The n-type dopant is as described above.

Subsequently, the second step of forming the light emitting layer 40 is performed. To adjust the Al composition ratio in forming the well layers 40w and the barrier layers 40b, the ratio between the flow rate of the Al source and the flow rate of the Ga source may be changed as appropriate. When the light emitting layer 40 is made of an AlGaN material, the growth temperature is preferably 1000° C. or more and 1400° C. or less, more preferably 1050° C. or more and 1350° C. or less.

Next, the third step of forming the AlN guide layer 50 on the light emitting layer 40 is performed. In the first embodiment, in this step, the AlN guide layer 50 is epitaxially grown directly on the light emitting layer 40 using a source gas composed of trimethylaluminum gas (TMA gas) and ammonia gas ($NH_3$ gas). In order to deliberately avoid the inclusion of other group III elements such as Ga, the source gas is particularly preferably composed of only trimethylaluminum gas (TMA gas) and ammonia gas ($NH_3$ gas). A carrier gas containing nitrogen as a main component is preferably used as the carrier gas, and nitrogen gas is more preferably used as the carrier gas. The growth temperature is preferably 1000° C. or more and 1400° C. or less, more preferably 1050° C. or more and 1350° C. or less. The AlN guide layer 50 can be made to have a thickness of 0.5 nm or more and 2.0 nm or less by appropriately selecting the growth time.

Subsequently, the fourth step of forming the electron blocking layer 60 on the AlN guide layer 50 is performed. Further, the fifth step of forming the p-type layer 70 on the electron blocking layer 60 is performed. As described above, the p-type layer 70 may be constituted by a p-type contact layer alone or may have a multi-layer structure including a p-type cladding layer and a p-type contact layer.

For example, a dopant for forming the p-type layer 70 may be appropriately selected from Mg, Zn, etc. For the Mg source, bis(cyclopentadienyl)magnesium ($CP_2Mg$) can be used, and for the Zn source, $ZnCl_2$ can be used. When doping is performed using a mixture of a plurality of dopants, a mixed gas of the sources of the dopants may be supplied into the chamber.

Here, when the electron blocking layer 60 is formed of an $Al_zGa_{1-z}N$ material, the electron blocking layer 60 may be formed using a gas mainly containing hydrogen as a carrier gas. As described above, TMA, TMG, and $NH_3$ gases are used as source gases, and a dopant source gas is appropriately selected and used. Note that when the AlN guide layer 50 is formed using nitrogen gas as a carrier gas and the electron blocking layer 60 is formed using hydrogen as a carrier gas, the carrier gases are necessarily switched. In this case, after forming the AlN guide layer 50, the supply of the TMA gas is stopped and switched to the supply of the carrier gas from nitrogen to hydrogen, and after a lapse of approximately 20 s to 1 min, TMA gas and TMG gas are supplied, thus forming the electron blocking layer 60.

In this specification, the term "carrier gas containing hydrogen as a main component (mainly containing hydrogen)" means a carrier gas in which the ratio of the volume of hydrogen to the total volume of the carrier gas is 60% or more. More preferably, the ratio is 85% or more. For such a carrier gas, a gas having a certain level of purity that is commercially available for semiconductor fabrication may be used. The same applies to "carrier gas containing nitrogen as a main component". Note that the volume ratio of the carrier gas here is tailored for gases supplied into the chamber and flown through a space adjacent to a wafer, and not for gases which are mainly used to purge a heater or the inner wall of the chamber and are exhausted without being flown through a space adjacent to the wafer. Specifically, even if a large amount of hydrogen is flown into a heater or to the inner wall of a chamber and then exhausted, when nitrogen is substantially flown to the vicinity of the wafer, the carrier gas is a "carrier gas containing nitrogen as a main component".

Although depending on the Al composition ratio, the growth temperature of the p-type layer 70 is preferably 1000° C. or more and 1400° C. or less, more preferably 1050° C. or more and 1350° C. or less. Further, the growth pressure in the chamber can be, for example, 10 Torr to 760 Torr. More preferably, the growth pressure is, for example, 20 Torr to 380 Torr. Note however that the growth temperature for forming the p-type contact layer having a low Al composition ratio in the p-type layer 70 is preferably 800° C. or more and 1400° C. or less, more preferably 900° C. or more and 1300° C. or less. Further, the growth pressure in the chamber can be, for example, 10 Torr to 760 Torr, and is preferably 20 Torr to 600 Torr. For the carrier gas, hydrogen gas or nitrogen gas or a mixed gas of hydrogen and nitrogen can be used as described above. Although not illustrated, when the p-type contact layer in the p-type layer has a multi-layer structure in which any one or more of the Al composition ratio, dopant species, dopant concentration, carrier gas used in the formation, and the like are varied; hydrogen gas can be used as a carrier gas for the AlN guide layer 50 side, and nitrogen gas can be used for the opposite side (that is, the p-type electrode 90 side), and vice versa. A p-type cladding layer may be provided; however, as described above, it is preferred that a p-type cladding layer is not provided.

Finally, the light emitting layer 40, the AlN guide layer 50, the electron blocking layer 60, and the p-type layer 70 are partially removed by for example etching; and the n-type electrode 80 can be formed on the exposed n-type layer 30, and the p-type electrode 90 can be formed on the p-type layer 70. Thus, the III-nitride semiconductor light-emitting device 100 can be produced according to the first embodiment of the production method of this disclosure.

Method of Producing III-Nitride Semiconductor Light-Emitting Device: Second Embodiment A second embodiment is similar to the first embodiment except that the AlN guide layer 50 is not formed directly on the light emitting layer 40 and an AlGaN layer having an Al composition ratio that is equal to or more than the Al composition ratio of the barrier layers 40b and is less than the Al composition ratio of the AlN guide layer 50 on the light emitting layer 40 in the third step, and the AlGaN layer is altered, thus the AlN guide layer 50 is formed. When the carrier gas is switched from nitrogen to hydrogen before forming the electron blocking layer 60, the AlGaN layer formed in the third step is exposed to a carrier gas atmosphere (for example, a carrier gas atmosphere containing hydrogen as a main component) in which the partial pressure of nitrogen is lower than that in the growth of the AlGaN layer. Thus, Ga is desorbed from the surface, resulting in the alteration of the AlGaN layer. As a result, the surface side of the AlGaN layer is altered into the AlN guide layer 50, and the light emitting layer side is left as the final barrier layer. The thicknesses of the AlN guide layer 50 and the final barrier layer can be controlled by changing the thickness of the AlGaN layer or the time during which the AlGaN layer is exposed to a carrier gas atmosphere in which the partial pressure of nitrogen is lower than that in the growth of the AlGaN layer by stopping the supply of the source gas of the group III element.

EXAMPLES

III-nitride light-emitting devices according to this disclosure will now be described in more detail using examples. However, this disclosure is not limited to the following examples in any way.

Example 11

A sapphire substrate (diameter: 2 in, thickness: 430 μm, plane orientation: (0001), off-angle θ in m-axis direction: 0.5°) was prepared. Next, an AlN layer having a center thickness of 0.60 μm (average thickness: 0.61 μm) was grown on the above sapphire substrate by MOCVD to obtain an AlN template substrate. Here, the growth temperature of the AlN layer was 1300° C., the growth pressure in the chamber was 10 Torr, and the growth gas flow rates of ammonia gas and TMA gas were set so that the V/III ratio was 163. The flow rate of a group V element gas ($NH_3$) was 200 sccm, and the flow rate of a group III element gas (TMA) was 53 sccm. For the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the above AlN template substrate was introduced into a heat treatment furnace. After the pressure in the furnace was reduced to 10 Pa, the furnace was purged with nitrogen gas to achieve a nitrogen gas atmosphere in the furnace, and the temperature inside the furnace was then raised, thus performing heat treatment on the AlN template substrate. The heat treatment was performed at a heating temperature of 1650° C. for a heating time of four hours.

Subsequently, an undoped AlGaN layer with a thickness of 200 nm in which the composition was graded to have Al composition ratios from 0.85 to 0.65 was formed as an undoped AlGaN layer by MOCVD. Next, as an n-type layer, a Si-doped n-type layer made of n-type $Al_{0.65}Ga_{0.35}N$ was formed to a thickness of 2 μm. According to a result of SIMS analysis, the Si concentration of the n-type layer was $1.0 \times 10^{19}$ atoms/cm$^3$.

Subsequently, a Si-doped n-type guide layer made of $Al_{0.65}Ga_{0.35}N$ was formed to a thickness of 20 nm on the n-type layer, and $Al_{0.70}Ga_{0.30}N$ was then formed as a barrier layer to a thickness of 4 nm. Next, two well layers made of $Al_{0.45}Ga_{0.55}N$ with a thickness of 3 nm and two barrier layers made of $Al_{0.70}Ga_{0.30}N$ with a thickness of 4 nm were alternately formed, and another well layer made of $Al_{0.45}Ga_{0.55}N$ with a thickness of 3 nm was formed thereon. Accordingly, the number N of either the well layers or the barrier layers was 3, the Al composition ratio (b) of the barrier layers was 0.70, and the Al composition ratio (w) of the well layers was 0.45. In the formation of the barrier layers, the barrier layers were doped with Si.

After that, on the third well layer, an undoped AlN guide layer was formed using nitrogen gas as a carrier gas. The thickness of the AlN guide layer was 1 nm. Next, while the supply of the TMA gas was ceased and ammonia gas was continuously supplied, the supply of nitrogen that was the carrier gas was ceased and hydrogen was supplied. After the carrier gas was changed to hydrogen, the supply of TMA gas and TMG gas that were source gases of group III elements was resumed, thus a Mg-doped electron blocking layer made of $Al_{0.68}Ga_{0.32}N$ was formed to a thickness of 40 nm. Accordingly, the Al composition ratio (z) of the electron blocking layer was 0.68, and the Al composition ratio (b) of the barrier layers was higher than the Al composition ratio (z) of the electron blocking layer, and the difference (b−z) was 0.02.

Subsequently, after the carrier gas was switched to nitrogen gas, a Mg-doped p-type layer (p-type contact layer) made of GaN was formed to a thickness of 150 nm. In the p-type layer with a thickness of 150 nm, a region that was to be in contact with the p-type electrode and had a thickness of 25 nm was formed into a layer having a high Mg concentration region by both reducing the flow rate of the TMG gas to increase the proportion of Mg and reducing the growth rate. According to SIMS analysis, the mean Mg concentration of a part of the p-type contact layer on the p-type electron blocking layer side with a thickness of 125 nm was $3.0 \times 10^{19}$ atoms/cm$^3$, and the mean Mg concentration of the high Mg concentration region was $1.2 \times 10^{20}$ atom/cm$^3$.

After that, a mask was formed on the p-type layer, and mesa etching was performed by dry etching to expose a part of the n-type layer. Next, a p-type electrode made of Ni/Au was formed on the p-type layer, and an n-type electrode made of Ti/Al was formed on the exposed n-type layer. Note that the p-type electrode had Ni with a thickness of 50 angstrom and Au with a thickness of 1500 angstrom. Further, the n-type electrode had Ti with a thickness of 200 angstrom and Al with a thickness of 1500 angstrom. Finally, contact annealing (RTA) was performed at 550° C. to finish the electrodes.

The specifications of each layer in the III-nitride semiconductor light-emitting device prepared as described above are given in Table 1.

TABLE 1

| | Al composition ratio | Dopant | Thickness |
|---|---|---|---|
| p-type contact layer | 0 | Mg | 150 nm |
| p-type electron blocking layer | 0.68 | Mg | 40 nm |
| AlN guide layer | 1 | — | 1 nm |
| Light emitting layer | 0.45 | — | 3 nm |
| | 0.70 | Si | 4 nm |
| | 0.45 | — | 3 nm |
| | 0.70 | Si | 4 nm |

TABLE 1-continued

|  | Al composition ratio | Dopant | Thickness |
|---|---|---|---|
|  | 0.45 | — | 3 nm |
|  | 0.70 | Si | 4 nm |
| n-type guide layer | 0.65 | Si | 20 nm |
| n-type semiconductor layer | 0.65 | Si | 2 μm |
| Undoped layer (Composition graded layer) | 0.65 | 0.85 |  | 200 nm |
| AlN layer | 1 | — | 0.6 μm |
| Sapphire substrate | — | — | 430 μm |

Example 12

A III-nitride semiconductor light-emitting device was prepared in the same manner as in Example 11 except that the Al composition ratio (b) of the barrier layers was 0.71, and the Al composition ratio of the n-type guide layer was 0.71. The Al composition ratio (z) of the electron blocking layer was 0.68, and the Al composition ratio (b) of the barrier layers was higher than the Al composition ratio (z) of the electron blocking layer, and the difference (b−z) was 0.03.

Example 13

A III-nitride semiconductor light-emitting device was prepared in the same manner as in Example 11 except that the Al composition ratio (b) of the barrier layers was 0.75. The Al composition ratio (z) of the electron blocking layer was 0.68, and the Al composition ratio (b) of the barrier layers was higher than the Al composition ratio (z) of the electron blocking layer, and the difference (b−z) was 0.07.

Example 14

A III-nitride semiconductor light-emitting device was prepared in the same manner as in Example 11 except that the Al composition ratio (b) of the barrier layers was 0.80. The Al composition ratio (z) of the electron blocking layer was 0.68, and the Al composition ratio (b) of the barrier layers was higher than the Al composition ratio (z) of the electron blocking layer, and the difference (b−z) was 0.12.

Example 15

A III-nitride semiconductor light-emitting device was prepared in the same manner as in Example 11 except that the Al composition ratio (b) of the barrier layers was 0.85. The Al composition ratio (z) of the electron blocking layer was 0.68, and the Al composition ratio (b) of the barrier layers was higher than the Al composition ratio (z) of the electron blocking layer, and the difference (b−z) was 0.17.

Comparative Example 11

A III-nitride semiconductor light-emitting device was prepared in the same manner as in Example 11 except that the Al composition ratio (b) of the barrier layers was 0.60. The Al composition ratio (z) of the electron blocking layer was 0.68, and the Al composition ratio (b) of the barrier layers was lower than the Al composition ratio (z) of the electron blocking layer, and the difference (b−z) was −0.08.

Comparative Example 12

A III-nitride semiconductor light-emitting device was prepared in the same manner as in Example 11 except that the Al composition ratio (b) of the barrier layers was 0.65. The Al composition ratio (z) of the electron blocking layer was 0.68, and the Al composition ratio (b) of the barrier layers was lower than the Al composition ratio (z) of the electron blocking layer, and the difference (b−z) was −0.03.

Comparative Example 13

A III-nitride semiconductor light-emitting device was prepared in the same manner as in Example 11 except that the Al composition ratio (b) of the barrier layers was 0.68, and the Al composition ratio of the n-type guide layer was 0.68. The Al composition ratio (z) of the electron blocking layer was 0.68, and the Al composition ratio (b) of the barrier layers was the same as the Al composition ratio (z) of the electron blocking layer, so the difference (b−z) was 0.

In Example 11 to Example 15 and Comparative Examples 11 to 13, the Al composition ratio (z) of the p-type electron blocking layer was 0.68, and was changed to 0.63 to perform an experiment in the following example. The conditions for preparing the III-nitride semiconductor light-emitting devices according to Examples 21 to 23 and Comparative Example 21 will be described below.

Example 21

A III-nitride semiconductor light-emitting device was prepared in the same manner as in Example 11 except that the Al composition ratio (b) of the barrier layers was 0.65, and the Al composition ratio (z) of the electron blocking layer was 0.63. The Al composition ratio (z) of the electron blocking layer was 0.63, and the Al composition ratio (b) of the barrier layers was higher than the Al composition ratio (z) of the electron blocking layer, and the difference (b−z) was 0.02.

Example 22

A III-nitride semiconductor light-emitting device was prepared in the same manner as in Example 11 except that the Al composition ratio (b) of the barrier layers was 0.75, and the Al composition ratio (z) of the electron blocking layer was 0.63. The Al composition ratio (z) of the electron blocking layer was 0.75, and the Al composition ratio (b) of the barrier layers was higher than the Al composition ratio (z) of the electron blocking layer, and the difference (b−z) was 0.12.

Example 23

A III-nitride semiconductor light-emitting device was prepared in the same manner as in Example 11 except that the Al composition ratio (b) of the barrier layers was 0.80, and the Al composition ratio (z) of the electron blocking layer was 0.63. The Al composition ratio (z) of the electron blocking layer was 0.80, and the Al composition ratio (b) of the barrier layers was higher than the Al composition ratio (z) of the electron blocking layer, and the difference (b−z) was 0.17.

Comparative Example 21

A III-nitride semiconductor light-emitting device was prepared in the same manner as in Example 11 except that the Al composition ratio (b) of the barrier layers was 0.60, and the Al composition ratio (z) of the electron blocking layer was 0.63. The Al composition ratio (z) of the electron blocking layer was 0.63, and the Al composition ratio (b) of the barrier layers was lower than the Al composition ratio (z) of the electron blocking layer, and the difference (b−z) was −0.03.

(Evaluation 1: Evaluation of Thickness and Al Composition Ratio of each Layer)

The thickness of each layer formed by epitaxial growth in Examples 11 to 15, 21 to 23 and Comparative Examples 11 to 13, and 21 were measured using an optical interferometric thickness measurement system.

Further, for layers including the barrier layers and the electron blocking layer that each had a thickness as small as several nanometers to several tens of nanometers, the thickness and the Al composition ratio of each layer was measured by TEM-EDS by performing a cross-sectional observation under the transmission electron microscope.

Moreover, for layers having a sufficiently large thickness (for example of 1 μm or more), the Al composition ratio of each target layer was found from the emission wavelength (band gap energy) obtained by a photoluminescence measurement.

(Evaluation 2: Light Output Power and Light Emission)

The light output power in each of Examples 11 to 15, 21 to 23 and Comparative Examples 11 to 13, and 21 was measured at a current of 10 mA through a Si photodiode (S1227-1010BQ manufactured by Hamamatsu Photonics K. K.). Further, the emission wavelength was also measured at a current of 10 mA using a fiber optics spectrometer (USB2000+ manufactured by Ocean Photonics).

The results of evaluating the III-nitride semiconductor light-emitting devices according to Examples 11 to 15, 21 to 23 and Comparative Examples 11 to 13, and 21 are given in Table 2, noting the Al composition ratios of the n-type guide layer, the barrier layers, and the electron blocking layer.

the electron blocking layer was 0.68 and b−z was the same, it was advantageous that the forward voltage was low; in some cases, the Al composition ratio z is preferably low for uses in which it is important to reduce the forward voltage. As such the Al composition ratio z of the electron blocking layer is appropriately set depending on use; however, the light output power was found to be likely to be high when the value of b−z was within the range specified in this disclosure irrespective of the value of z.

INDUSTRIAL APPLICABILITY

This disclosure provides a III-nitride semiconductor light-emitting device that is useful because it has more excellent light output power compared with conventional devices.

REFERENCE SIGNS LIST

10: Substrate
20: AlN layer
30: n-type layer
40: Light emitting layer
40b: Barrier layer
40w: Well layer
50: AlN guide layer
60: Electron blocking layer
70: p-type layer
80: n-type electrode
90: p-type electrode
100: III-nitride semiconductor light-emitting device

The invention claimed is:

1. A III-nitride semiconductor light-emitting device having an emission wavelength of 200 nm to 350 nm, comprising:
an n-type III-nitride semiconductor layer; a III-nitride semiconductor light emitting layer in which N barrier layers and N well layers having a smaller band gap than the N barrier layers, where N is an integer, are alternately stacked in this order; an AlN guide layer; an electron blocking layer; and a p-type III-nitride semiconductor layer in this order,
wherein the electron blocking layer is made of p-type $Al_zGa_{1-z}N$, where $0.50 \leq z \leq 0.80$, and
the N barrier layers are made of n-type $Al_bGa_{1-b}N$, where an Al composition ratio b of the N barrier layers is

TABLE 2

| | Al composition ratio of n-type guide layer | Al composition ratio (b) of barrier layer | Al composition ratio (z) of electron blocking layer | b − z | Optical output power (mW) | Emission wavelength (nm) |
|---|---|---|---|---|---|---|
| Comparative Example 11 | 0.65 | 0.60 | 0.68 | −0.08 | 1.44 | 280 |
| Comparative Example 12 | 0.65 | 0.65 | 0.68 | −0.03 | 1.39 | 275 |
| Comparative Example 13 | 0.68 | 0.68 | 0.68 | 0 | 1.45 | 286 |
| Example 11 | 0.65 | 0.70 | 0.68 | 0.02 | 1.50 | 279 |
| Example 12 | 0.71 | 0.71 | 0.68 | 0.03 | 1.51 | 278 |
| Example 13 | 0.65 | 0.75 | 0.68 | 0.07 | 1.60 | 280 |
| Example 14 | 0.65 | 0.80 | 0.68 | 0.12 | 1.61 | 279 |
| Example 15 | 0.65 | 0.85 | 0.68 | 0.17 | 1.49 | 279 |
| Example 21 | 0.65 | 0.65 | 0.63 | 0.02 | 1.01 | 278 |
| Example 22 | 0.65 | 0.75 | 0.63 | 0.12 | 1.11 | 281 |
| Example 23 | 0.65 | 0.80 | 0.63 | 0.17 | 1.09 | 278 |
| Comparative Example 21 | 0.65 | 0.60 | 0.63 | −0.03 | 0.88 | 280 |

Table 2 demonstrates that the light output power was increased in cases where the Al composition ratio (b) of the barrier layers was made higher than the Al composition ratio (z) of the electron blocking layer.

In Examples 21 to 23 and Comparative Example 21, the Al composition ratio z of the electron blocking layer was 0.63. In such cases, although the light output power was lower than in the cases where the Al composition ratio z of greater than an Al composition ratio z of the electron blocking layer, and satisfies a relationship $z+0.01 \leq b \leq 0.95$.

2. The III-nitride semiconductor light-emitting device according to claim 1, wherein the Al composition ratio b of the N barrier layers satisfies a relationship $b \leq z+0.20$.

3. The III-nitride semiconductor light-emitting device according to claim 1, wherein a thickness of the AlN guide layer is 0.5 nm or more and 2.0 nm or less.

4. The III-nitride semiconductor light-emitting device according to claim 1, wherein an Nth well layer of the N well layers in the III-nitride semiconductor light emitting layer is in contact with the AlN guide layer, or wherein a final barrier layer of the N barrier layers having an Al composition ratio that is equal to or more than the Al composition of the N barrier layers and is less than the Al composition ratio of the AlN guide layer is provided between the Nth well layer in the III-nitride semiconductor light emitting layer and the AlN guide layer, and a thickness of the final barrier layer is 1.5 nm or less.

5. A method of producing a III-nitride semiconductor light-emitting device having an emission wavelength of 200 nm to 350 nm, the method comprising:

a first step of forming an n-type III-nitride semiconductor layer;

a second step of forming a III-nitride semiconductor light emitting layer by alternately staking N barrier layers and N well layers having a smaller band gap than the N barrier layers, where N is an integer, in this order on the n-type III-nitride semiconductor layer;

a third step of forming an AlN guide layer on the III-nitride semiconductor light emitting layer;

a fourth step of forming an electron blocking layer on the AlN guide layer; and a fifth step of forming a p-type semiconductor layer on the electron blocking layer, wherein the electron blocking layer is made of p-type $Al_zGa_{1-z}N$, where $0.50 \leq z \leq 0.80$, and the N barrier layers are made of n-type $Al_bGa_{1-b}N$, where an Al composition ratio b of the N barrier layers is greater than an Al composition ratio z of the electron blocking layer, and satisfies a relationship $z+0.01 \leq b \leq 0.95$.

* * * * *